(12) United States Patent
Kwon et al.

(10) Patent No.: US 10,935,817 B2
(45) Date of Patent: Mar. 2, 2021

(54) OPTICAL DEVICE AND DRIVING METHOD THEREOF

(71) Applicant: ELECTRONICS AND TELECOMMUNICATIONS RESEARCH INSTITUTE, Daejeon (KR)

(72) Inventors: Oh Kee Kwon, Sejong-si (KR); Kisoo Kim, Seoul (KR); Su Hwan Oh, Daejeon (KR); Chul-Wook Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 16/584,363

(22) Filed: Sep. 26, 2019

(65) Prior Publication Data

US 2020/0103678 A1   Apr. 2, 2020

(30) Foreign Application Priority Data

Oct. 1, 2018 (KR) .................. 10-2018-0117236
Jul. 17, 2019 (KR) .................. 10-2019-0086334

(51) Int. Cl.
*G02F 1/01* (2006.01)

(52) U.S. Cl.
CPC ............ *G02F 1/011* (2013.01); *G02F 1/0147* (2013.01)

(58) Field of Classification Search
None
See application file for complete search history.

(56) References Cited

U.S. PATENT DOCUMENTS 6,636,668 B1 * 10/2003 Al-Hemyari ....... G02B 6/12007
385/16
7,486,709 B2    2/2009 Hu et al.
(Continued)

FOREIGN PATENT DOCUMENTS

KR       100576710 B1    5/2006
KR       101405419 B1    6/2014
KR    1020170055902 A    5/2017

OTHER PUBLICATIONS

L. A. Johansson, et al., "Widely Tunable EAM-Integrated SGDBR Laser Transmitter for Analog Applications", IEEE Photonics Technology Letters, vol. 15, No. 9, pp. 1285-1287, Sep. 2003.
(Continued)

*Primary Examiner* — Chad H Smith
(74) *Attorney, Agent, or Firm* — Rabin & Berdo, P.C.

(57) ABSTRACT

An optical device according to the embodiment of the inventive concept includes a waveguide path including a light generation region, a wavelength variable region, and a light modulation region, a first light waveguide layer provided in the light generation region to generate light, a second light waveguide layer provided in the wavelength variable region and connected to the first light waveguide layer, a ring-shaped third light waveguide layer provided in the light modulation region and connected to the second light waveguide layer, and first and second light modulation electrodes spaced apart from each other with the light modulation region therebetween. Here, the first light modulation electrode, the third light waveguide layer, and the second light modulation electrode vertically overlap each other.

8 Claims, 13 Drawing Sheets

(56) References Cited

U.S. PATENT DOCUMENTS

| | | |
|---|---|---|
| 8,422,530 B2 | 4/2013 | Yoon |
| 2005/0123306 A1* | 6/2005 | Ilchenko ............ G02B 6/29395 398/161 |
| 2005/0286602 A1* | 12/2005 | Gunn ................ G02B 6/12007 372/94 |
| 2007/0110453 A1* | 5/2007 | Akiyama ........... G02B 6/12004 398/182 |
| 2014/0064306 A1 | 3/2014 | Yoon et al. |
| 2017/0040773 A1 | 2/2017 | Chimot et al. |

OTHER PUBLICATIONS

N. Andriolli, et al., "InP monolithically integrated coherent Transmitter", Optics Express, vol. 23, No. 8, pp. 10741-10746, Apr. 16, 2015.

\* cited by examiner

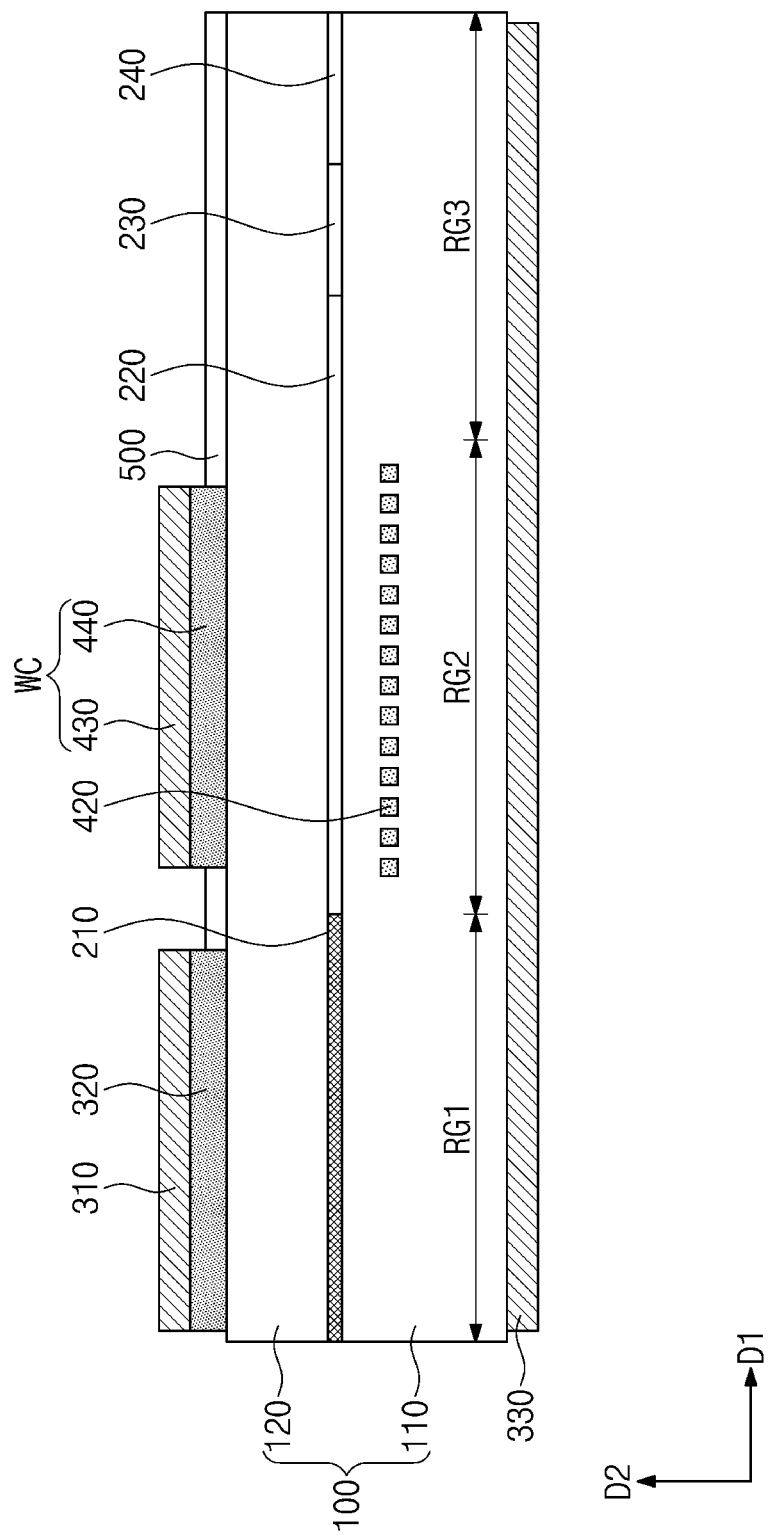

OPTICAL DEVICE AND DRIVING METHOD THEREOF

CROSS-REFERENCE TO RELATED APPLICATIONS

This U.S. non-provisional patent application claims priority under 35 U.S.C. § 119 of Korean Patent Application Nos. 10-2018-0117236, filed on Oct. 1, 2018, and 10-2019-0086334, filed on Jul. 17, 2019, the entire contents of which are hereby incorporated by reference.

BACKGROUND

The present disclosure herein relates to an optical device and a driving method thereof. More particularly, the present disclosure herein relates to an optical device including a wavelength variable region and a light modulation region and a driving method thereof.

An optical device integrated with a wavelength variable light source and a light intensity modulator is used for a wavelength division multiplexing (WDM) system, and recently used as a light source of each of a next generation-passive optical network (NG-PON) and a mobile front-haul network.

Typically, an intensity modulator of the wavelength variable light source is integrated with an electro-absorption modulator (EAM) or a Mach-Zehnder modulator (MZM).

SUMMARY

The present disclosure provides an optical device for emitting light having a constant light modulation characteristic.

An embodiment of the inventive concept provides an optical device including: a waveguide path including a light generation region, a wavelength variable region, and a light modulation region; a first light waveguide layer provided in the light generation region to generate light; a second light waveguide layer provided in the wavelength variable region and connected to the first light waveguide layer; a ring-shaped third light waveguide layer provided in the light modulation region and connected to the second light waveguide layer; and first and second light modulation electrodes spaced apart from each other with the light modulation region therebetween. Here, the first light modulation electrode, the third light waveguide layer, and the second light modulation electrode vertically overlap each other.

In an embodiment, the optical device may further include gratings provided in the wavelength variable region.

In an embodiment, the second light waveguide layer may extend in a first direction, and the gratings may be arranged in the first direction.

In an embodiment, the optical device may further include an ohmic layer disposed between the first light modulation electrode and the light modulation region.

In an embodiment, the optical device may further include a wavelength conversion part disposed on the wavelength variable region.

In an embodiment, the wavelength conversion part may include a heating element.

In an embodiment, a peak wavelength of the light may be converted from a first wavelength to a second wavelength by the wavelength conversion part, a difference between the first wavelength and the second wavelength may be defined as a first wavelength difference, a free spectral range (FSR) of the light emitted from the light modulation region may be defined as a second wavelength difference, and an integer multiple of the second wavelength difference may be the same as the first wavelength difference.

In an embodiment, the second wavelength difference may satisfy a mathematical equation below:

$$\text{second wavelength difference} = c/nL \quad \text{[Mathematical equation]}$$

In an embodiment of the inventive concept, a method for driving an optical device, the method including: generating light in a light generation region of a waveguide path; converting a peak wavelength of the light in a wavelength variable region of the waveguide path, wherein the peak wavelength of the light is converted from a first wavelength to a second wavelength; and modulating the light in a light modulation region of the waveguide path. Here, a difference between the first wavelength and the second wavelength is defined as a first wavelength difference, a free spectral range (FSR) of the modulated light is defined as a second wavelength difference, and an integer multiple of the second wavelength difference is the same as the first wavelength difference.

In an embodiment, the modulating of the light in the light modulation region may include modulating the light having a wavelength converted in the wavelength variable region by using a ring-shaped light waveguide layer in the light modulation region.

In an embodiment, the modulating of the light in the light modulation region may include changing a refractive index of each of the light modulation region and the ring-shaped light waveguide layer by using an electrode vertically overlapping the ring-shaped light waveguide layer.

In an embodiment, the second wavelength difference may satisfy a mathematical equation below:

$$\text{second wavelength difference} = c/nL \quad \text{[Mathematical equation]}$$

In an embodiment, the converting of the peak wavelength of the light in the wavelength variable region may include converting the peak wavelength of the light by using a wavelength conversion part provided on the wavelength variable region.

In an embodiment, the wavelength conversion part may include a heating element.

In an embodiment, the wavelength conversion part may include an ohmic layer and an electrode.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 7 is a cross-sectional view of an optical device according to an embodiment of the inventive concept;

DETAILED DESCRIPTION

Figure 1A:
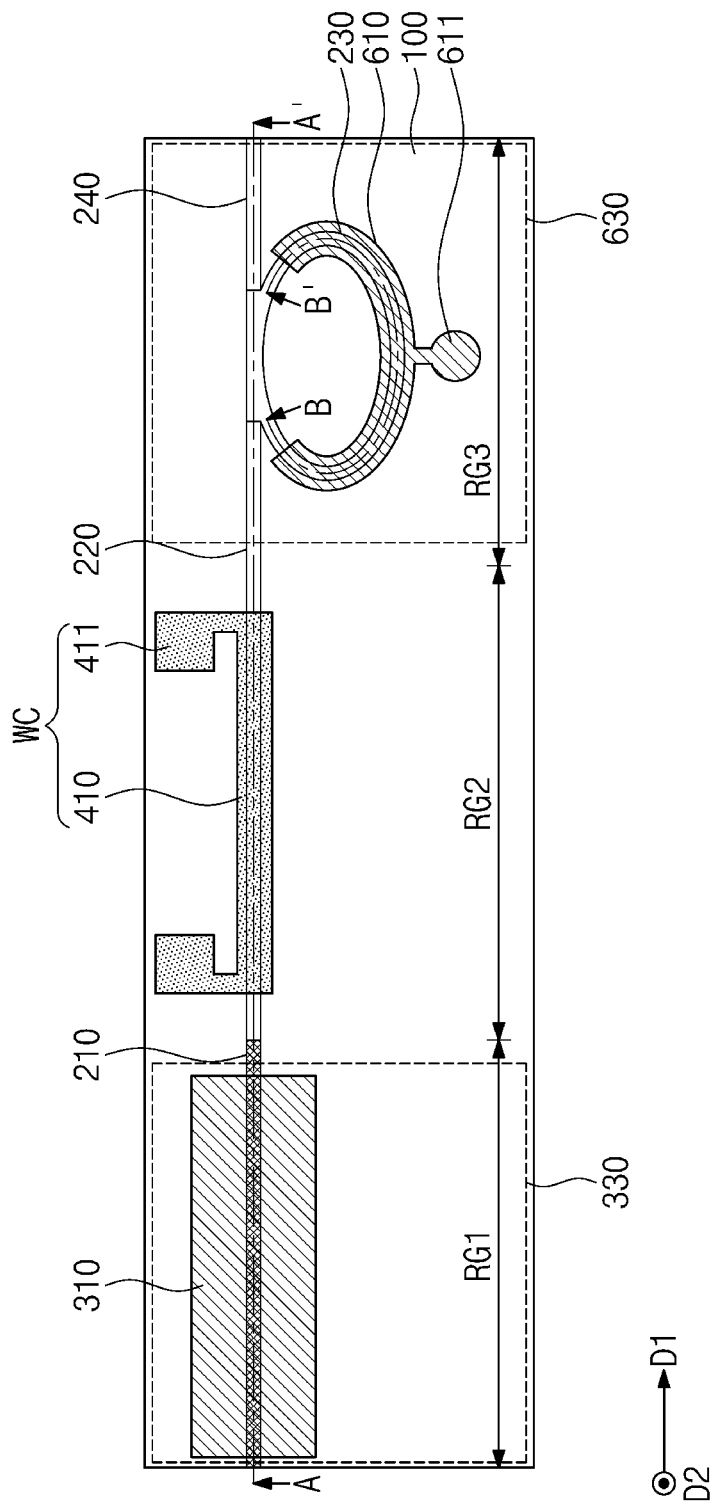
FIG. 1A is a plan view illustrating an optical device according to an embodiment of the inventive concept.

Advantages and features of the present invention, and implementation methods thereof will be clarified through following embodiments described with reference to the accompanying drawings. The present invention may, however, be embodied in many different forms and should not be construed as being limited to the embodiments set forth herein. Rather, these embodiments are provided so that this disclosure will be thorough and complete, and will fully convey the concept of the invention to those skilled in the art. Further, the present invention is only defined by scopes of claims. Like reference numerals refer to like elements throughout.

In the following description, the technical terms are used only for explaining a specific exemplary embodiment while not limiting the present disclosure. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components. Hereinafter, exemplary embodiments will be described in detail with reference to the accompanying drawings.

Figure 1B:
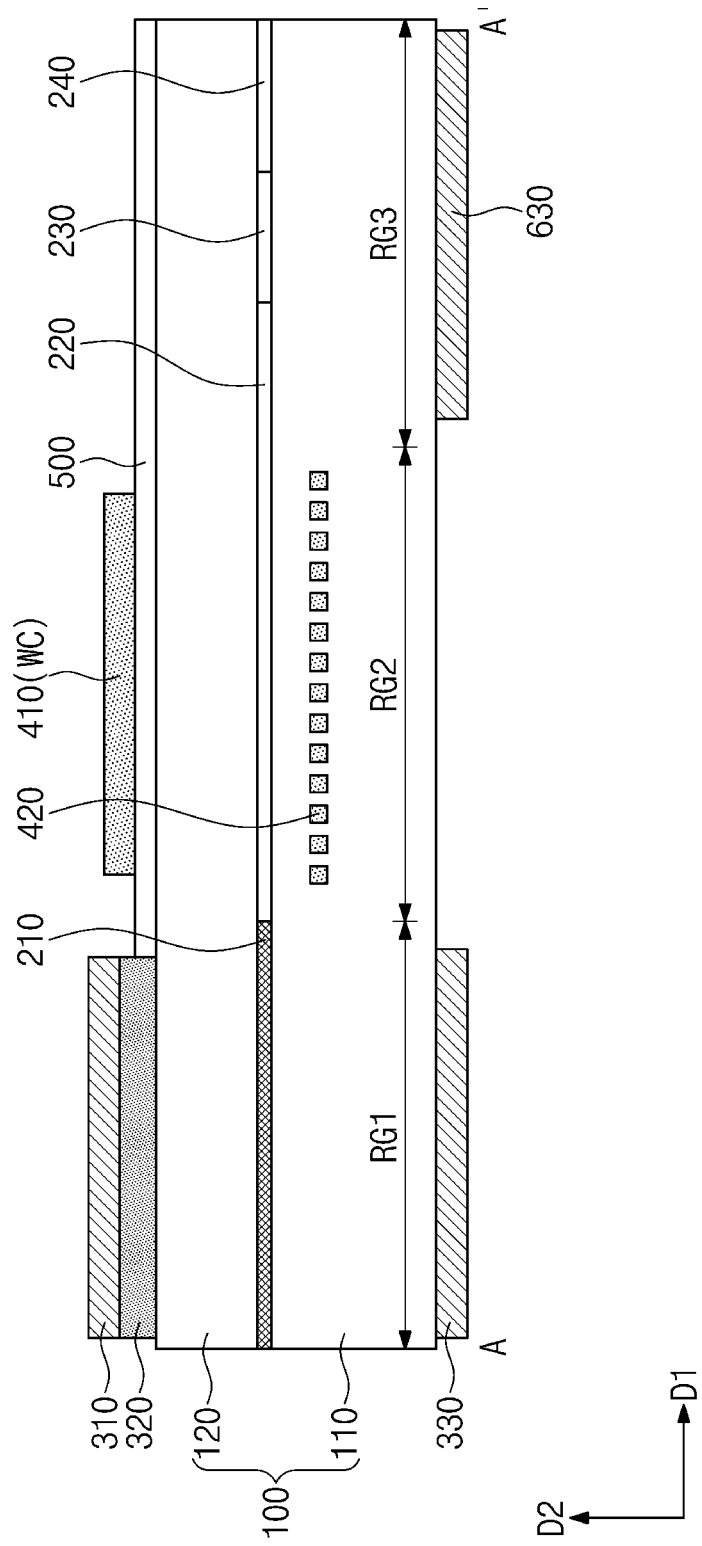
FIG. 1B is a cross-sectional view taken along line A-A' of FIG. 1A.
Figure 1C:
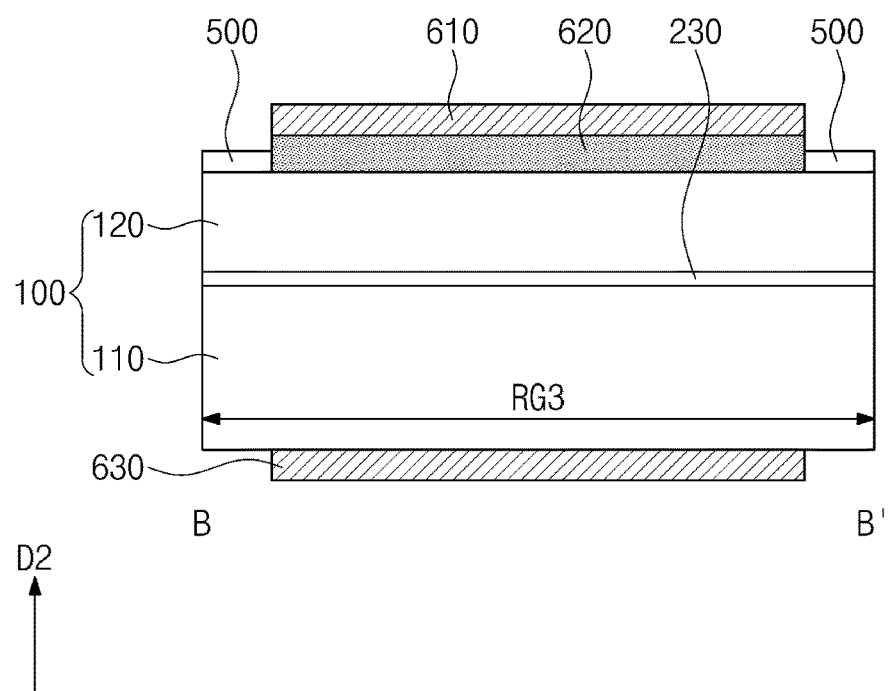
FIG. 1C is a cross-sectional view taken along line B-B' of FIG. 1A.
Figure 1D:
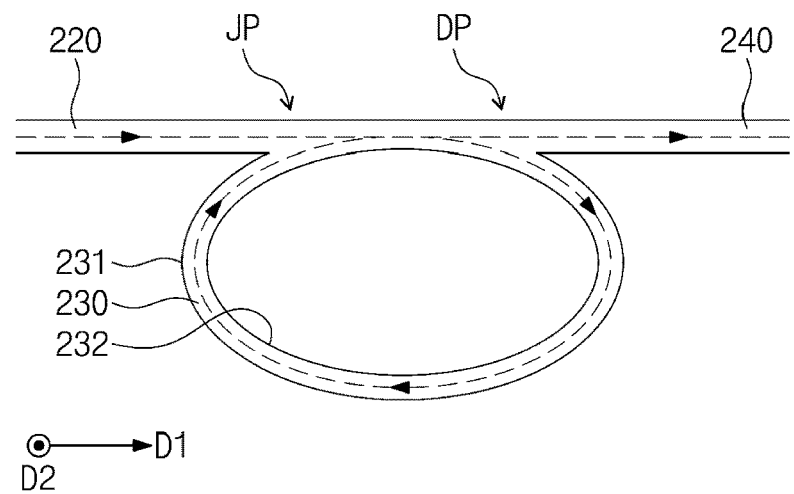
FIG. 1D is a view for explaining a third light waveguide layer in detail.

FIG. 1A is a plan view illustrating an optical device according to an embodiment of the inventive concept. FIG. 1B is a cross-sectional view taken along line A-A' of FIG. 1A. FIG. 1C is a cross-sectional view taken along line B-B' of FIG. 1A. FIG. 1D is a view for explaining a third light waveguide layer in detail.

Referring to FIGS. 1A, 1B, 1C, and 1D, the optical device according to an embodiment of the inventive concept may include a waveguide path 100.

The waveguide path 100 may include a lower clad layer 110, an upper clad layer 120, and light waveguide layers 210, 220, 230, and 240. The lower clad layer 110 may include an n-type semiconductor material. The upper clad layer 120 may include a p-type semiconductor material. For example, the waveguide path 100 may include InP or AlGaAs.

The waveguide path 100 may include a light generation region RG1, a wavelength variable region RG2, and a light modulation region RG3. The light generation region RG1, the wavelength variable region RG2, and the light modulation region RG3 may be sequentially arranged in a first direction D1.

The first to fourth light waveguide layers 210, 220, 230, and 240 may be provided in the waveguide path 100. The first to fourth light waveguide layers 210, 220, 230, and 240 may be provided between the lower clad layer 110 and the upper clad layer 120. In terms of a cross-section in FIG. 1B, the lower clad layer 110, the first to fourth light waveguide layers 210, 220, 230, and 240, and the upper clad layer 120 may be sequentially arranged in a second direction D2. The second direction D2 may be perpendicular to the first direction D1. Each of the first to fourth light waveguide layers 210, 220, 230, and 240 may have a refractive index greater than that of the waveguide path 100.

The first light waveguide layer 210 may be provided in the light generation region RG1. The first light waveguide layer 210 may have a stick or bar shape extending in the first direction D1. The first light waveguide layer 210 may contain an intrinsic semiconductor material. The first light waveguide layer 210 may include materials having the same compound composition and/or the same band gap as each other. The first light waveguide layer 210 may have a multiple quantum well (MQW) structure. The first light waveguide layer 210 may be an active layer. The active layer may generate optical gain. For example, the first light waveguide layer 210 may include InGaAsP, InGaAs, InGaAlAs, or GaAs.

The second light waveguide layer 220 may extend until the light modulation region RG3 from the wavelength variable region RG2. The second light waveguide layer 220 may have a stick or bar shape extending in the first direction D1. The second light waveguide layer 220 may be connected to the first light waveguide layer 210.

The third light waveguide layer 230 may be provided in the light modulation region RG3. The third light waveguide layer 230 may have a ring shape having a central axis that is parallel to the second direction D2. The third light waveguide layer 230 may be connected to the second light waveguide layer 220. The second light waveguide layer 220 and the third light waveguide layer 230 may have the same width and thickness as each other.

The fourth light waveguide layer 240 may be provided in the light modulation region RG3. The fourth light waveguide layer 240 may have a stick or bar shape extending in the first direction D1. The fourth light waveguide layer 240 may be connected to the third light waveguide layer 230. The third light waveguide layer 230 and the fourth light waveguide layer 240 may have the same width and thickness as each other.

Each of the second to fourth light waveguide layers 220, 230, and 240 may include an intrinsic semiconductor. The second to fourth light waveguide layers 220, 230, and 240 may include materials having the same compound composition and/or the same band gap as each other. The second to fourth light waveguide layers 220, 230, and 240 may be passive layers. The passive layers may not generate optical gain. Each of the second to fourth light waveguide layers 220, 230, and 240 may include InGaAsP, InGaAs, InGaAlAs, or GaAs.

The optical device according to an embodiment of the inventive concept may further include a first light generation electrode 310, a first ohmic layer 320, and a second light generation electrode 330.

The first ohmic layer 320 contacting the upper clad layer 120 in the light generation region RG1 may be provided, and the first light generation electrode 310 may be provided on the first ohmic layer 320. The second light generation electrode 330 contacting the lower clad layer 110 in the light generation region RG1 may be provided. The second light generation electrode 330 may have a plate shape. That is, the second light generation electrode 330 may cover the entire lower clad layer 110 in the light generation region RG1. Also, unlike as illustrated, the second light generation electrode 330 may extend from the light generation region RG1 to the light modulation region RG3. Here, the second light generation electrode 330 may cover the entire lower clad layer 110 in the light generation region RG1, the wavelength variable region RG2, and the light modulation region RG3. The first and second light generation electrodes 310 and 330 may be attached to each other with the first ohmic layer 320, the upper clad layer 120, the first light waveguide layer 210, and the lower clad layer 110 therebetween. The first light generation electrode 310, the first ohmic layer 320, and the second light generation electrode 330 may overlap perpendicularly to each other (i.e., in the second direction D2). A portion of the first light generation electrode 310, a portion of the first ohmic layer 320, and a portion of the second light generation electrode 330 may overlap perpendicularly to the first light waveguide layer 210.

Each of the first and second light generation electrodes 310 and 330 may include at least one of gold, silver, copper, aluminum, platinum, tungsten, titanium, tantalum, molybdenum, indium, nickel, chrome, or magnesium. The first ohmic layer 320 may include a p-type semiconductor material. For example, the first ohmic layer 320 may include InGaAs or GaAs.

The optical device according to an embodiment of the inventive concept may further include an insulation layer 500, a wavelength conversion part WV, and gratings 420.

The insulation layer 500 may cover may cover the upper clad layer 120 in the wavelength variable region RG2 and the light modulation region RG3. The insulation layer 500 may include a silicon oxide or a silicon nitride.

The wavelength conversion part WV may be provided on the insulation layer 500 disposed on the wavelength variable region RG2. The wavelength conversion part WV may include a heating element 410 and heating pads 411. The heating element 410 may extend in the first direction D1. The heating pads 411 may be connected to both ends of the heating element 410. For example, the heating element 410 may include a nickel-chrome (Ni—Cr) alloy, platinum (Pt), or titanium (Ti). For example, each of the heating pads 411 may include metal.

The gratings 420 may be provided in the lower clad layer 110 in the wavelength variable region RG2 or the upper clad layer 120 in the wavelength variable region RG2. The gratings 420 may be spaced apart from each other in the first direction DR1. The gratings 420 may be arranged at a constant distance in the first direction D1. The gratings 420 may be Bragg gratings.

The heating element 410, the second light waveguide layer 220, and the gratings 420 may vertically overlap each other.

The optical device according to an embodiment of the inventive concept may further include a first light modulation electrode 610, an electrode pad 611, a second ohmic layer 620, and a second light modulation electrode 630.

The second ohmic layer 620 contacting the upper clad layer 120 in the light modulation region RG3 may be provided, and the first light modulation electrode 610 may be provided on the second ohmic layer 620. The second light modulation electrode 630 contacting the lower clad layer 110 in the light modulation region RG3 may be provided. The first and second light modulation electrodes 610 and 630 may be attached to each other with the second ohmic layer 620, the upper clad layer 120, the third light waveguide layer 230, and the lower clad layer 110 therebetween.

In terms of a planar view according to FIG. 1A, each of the first light modulation electrode 610 and the second ohmic layer 620 may have a ring shape having opened one side. In other words, in terms of the planar view according to FIG. 1A, each of the first light modulation electrode 610 and the second ohmic layer 620 may have a C-shape. The second light modulation electrode 630 may have a plate shape. That is, the second light modulation electrode 630 may cover the entire lower clad layer 110 in the light modulation region RG3. The first light modulation electrode 610 and the second ohmic layer 620 may vertically overlap each other. A portion of the first light modulation electrode 610 and a portion of the second ohmic layer 620 may vertically overlap the third light waveguide layer 230. The second light modulation electrode 630 may vertically overlap the first light modulation electrode 610 and the second to fourth light waveguide layers 220, 230, and 240 below the lower clad layer 110 in the light modulation region RG3.

Each of the first and second light modulation electrodes 610 and 630 may include at least one of gold, silver, copper, aluminum, platinum, tungsten, titanium, tantalum, molybdenum, indium, nickel, chrome, or magnesium. The second ohmic layer 620 may include a p-type semiconductor material. For example, the second ohmic layer 620 may include InGaAs or GaAs.

The electrode pad 611 connected to the first light modulation electrode 610 may be provided. The electrode pad 611 may include metal.

The optical device according to an embodiment of the inventive concept may be provided by monolithically integrating the wavelength variable region RG2 and the light modulation region RG3. In other words, in the optical device according to the embodiment, the wavelength variable region RG2 and the light modulation region RG3 may be provided on one substrate.

In describing an operation of the optical device according to the embodiment, when a voltage is applied to the first light generation electrode 310 and the second light generation electrode 330, the first light waveguide layer 210 may generate light. The light generated from the first light waveguide layer 210 may travel along the second light waveguide layer 220 in the first direction D1.

The light traveled along the second light waveguide layer 220 may be reflected or resonated by the gratings 420. The light transmitted through the gratings 420 may have a specific peak wavelength.

The light transmitted through the wavelength variable region RG2 may have a wavelength that is varied by the wavelength conversion part WC. In particular, the heating element 410 may be heated by a voltage applied to the heating pads 411. As the heating element 410 is heated, the upper clad layer 120, the second light waveguide layer 220, the lower clad layer 110, and the gratings 420 in the wavelength variable region RG2 may be heated. As the upper clad layer 120, the second light waveguide layer 220, the lower clad layer 110, and the gratings 420 in the wavelength variable region RG2 are heated, a refractive index of each of the upper clad layer 120, the second light waveguide layer 220, the lower clad layer 110, and the gratings 420 in the wavelength variable region RG2 may be varied, and the peak wavelength of the light transmitted through the wavelength variable region RG2 may be varied. According to an operation condition of the wavelength conversion part WC, a variation degree of the peak wavelength of the light transmitted through the wavelength variable region RG2 may be changed. Here, the refractive index that is varied as the heating element 410 is heated may represent an effective refractive index. The effective refractive index may be linearly varied according to the Bragg condition as in [mathematical equation 1] below.

$$\lambda = 2n_{eff}\Lambda \qquad \text{[Mathematical equation 1]}$$

In the above [mathematical equation 1], $\lambda$, is a wavelength of light, $n_{eff}$ is an effective refractive index, and $\Lambda$ is a frequency of gratings.

Referring to FIG. 1D, the light transmitted through the second light waveguide layer 220 may be transmitted through the third light waveguide layer 230 and the fourth light waveguide layer 240. A joining point JP and a diverging point DP may be defined by the second to fourth light waveguide layers 220, 230, and 240. The joining point JP may be a point at which the second light waveguide layer 220 and the third light waveguide layer 230 are connected to each other. The diverging point DP may be a point at which the third light waveguide layer 230 and the fourth light waveguide layer 240 are connected to each other.

At the diverging point DP, the light transmitted through the second light waveguide layer 220 may be diverged to the third light waveguide layer 230 and the fourth light waveguide layer 240. A ratio diverged to the third light waveguide layer 230 and the fourth light waveguide layer 240 may be about 1:1. The light diverged to the fourth light waveguide layer 240 may be emitted to the outside of the light modulation region RG3. The light diverged to the third light waveguide layer 230 may be completely transmitted through the third light waveguide layer 230 and be joined with light transmitted through the second light waveguide layer 220 at the joining point JP, and be diverged again at the diverging point DP.

As a result, an intensity of light emitted to the outside through the fourth light waveguide layer 240 may be modulated. In other words, as a voltage is applied to the first light modulation electrode 610 and the second light modulation electrode 630, the refractive index of each of the upper clad layer 120, the third light waveguide layer 230, and the lower clad layer 110 may be varied, and a time for light transmitted through the third light waveguide layer 230 may be varied. Thus, the intensity of light emitted to the outside through the fourth light waveguide layer 240 may be modulated.

Figure 2A:
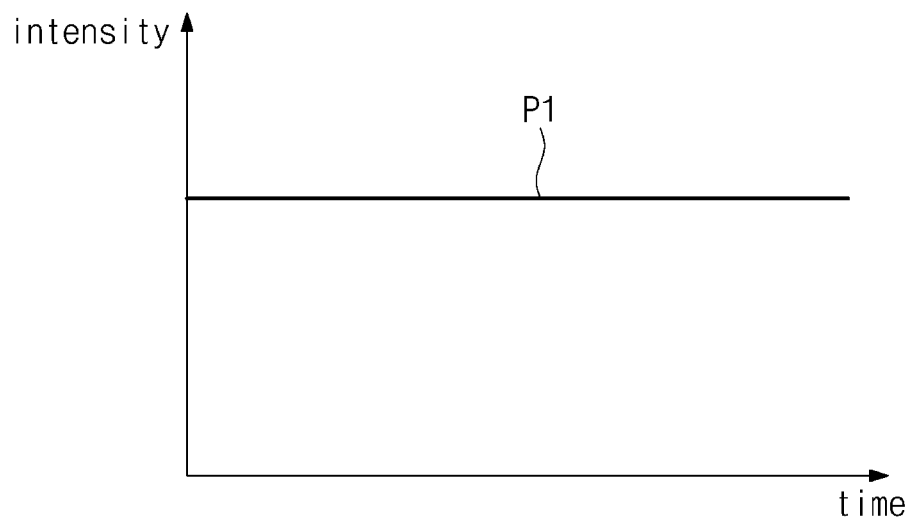
FIG. 2A is a view representing a light intensity of first light.
Figure 2B:
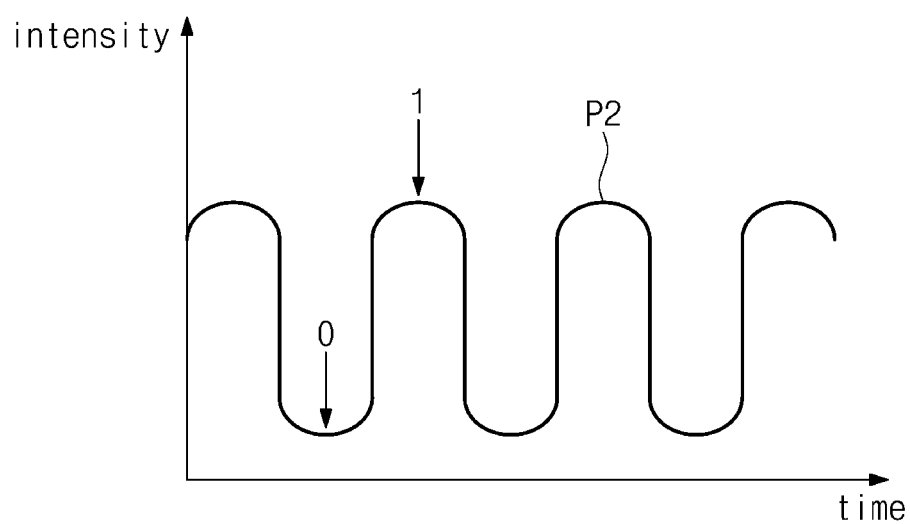
FIG. 2B is a view representing a light intensity of second light.
Figure 3A:
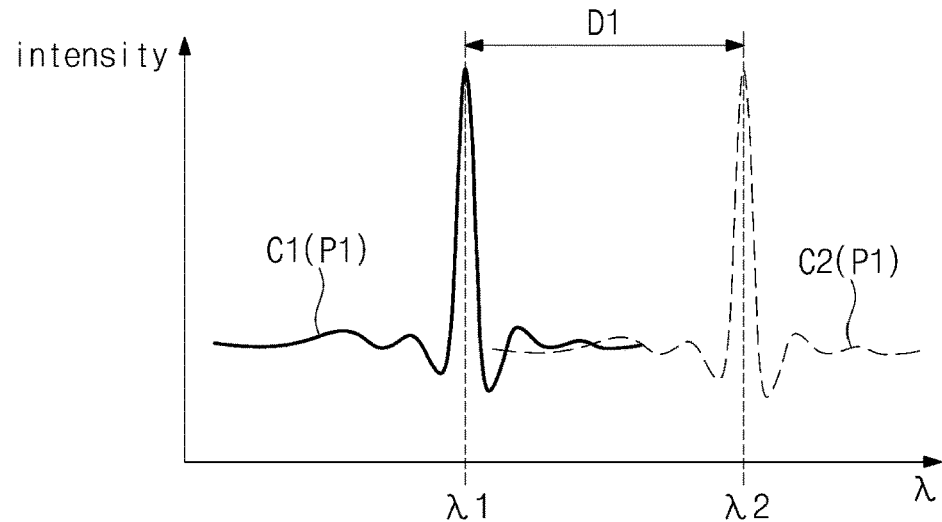
FIG. 3A is a view representing a light intensity spectrum of the first light.
Figure 3B:
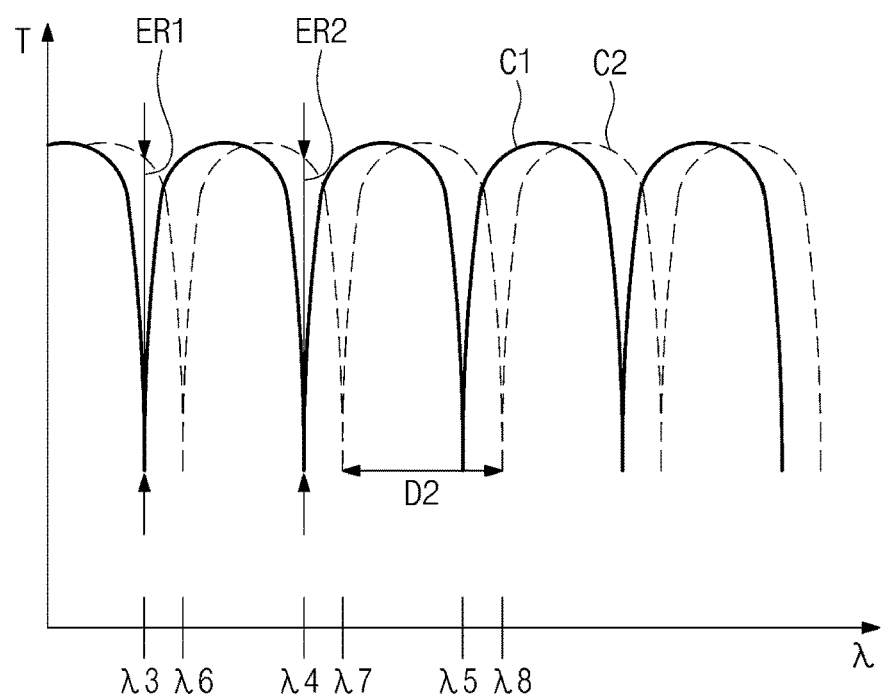
FIG. 3B is a view representing a transmission ratio between the first light and the second light.

FIG. 2A is a view representing a light intensity of first light. FIG. 2B is a view representing a light intensity of second light. FIG. 3A is a view representing a light intensity spectrum of the first light. FIG. 3B is a view representing a transmission ratio between the first light and the second light.

In the below description on FIGS. 2A, 2B, 3A, and 3B, light generated in the light generation region RG1 and transmitted through the wavelength variable region RG2 is defined as first light P1, and when the first light P1 is transmitted through the light modulation region RG3 and then emitted, the emitted light is defined as second light P2. Also, a case in which a wavelength is not varied by the wavelength conversion part WC (i.e., a case in which the wavelength conversion part WC is not operated) is defined as a first case C1, and a case in which a wavelength is varied by the wavelength conversion part WC is defined as a second case C2.

Referring to FIG. 2A, the first light P1 transmitted through the wavelength variable region RG2 may have a constant light intensity according to time.

Referring to FIG. 2B, the second light emitted from the light modulation region RG3 may have a light intensity that is not constant according to time. Particularly, in the second light P2, a time at which a light intensity is relatively great and a time at which a light intensity is relatively small may be alternately repeated. The second light P2 may have a "1" signal at the time at which a light intensity is relatively great and a "0" signal at the time at which a light intensity is relatively small.

As a result, the light intensity of the first light P1 may be modulated when the first light P1 is transmitted through the light modulation region RG3.

Referring to FIG. 3A, a light intensity spectrum of the first light P1 in the first case C1 and the second case C2 may be checked.

In the first case C1, the first light P1 may have a peak wavelength of a first wavelength $\lambda 1$.

In the second case C2, the first light P1 may have a peak wavelength of a second wavelength $\lambda 2$.

As a wavelength of light transmitted through the wavelength variable region RG2 is varied according to an operation of the wavelength conversion part WC, a light intensity peak may be converted from the first wavelength $\lambda 1$ to the second wavelength $\lambda 2$.

A difference between the first wavelength $\lambda 1$ to the second wavelength $\lambda 2$ may be defined as a first wavelength difference D1. The first wavelength difference D1 may be defined as a wavelength division multiplexing (WDM) grid.

Referring to FIG. 3B, a Y-axis represents a transmission ratio T between the first light P1 and the second light P2. The transmission ratio T of the Y axis is a dB value obtained by dividing a light intensity of the second light P2 by a light intensity of the first light P1.

Referring to FIG. 3B, the transmission ratio T in the first case C1 and the second case C2 may be checked. In the first case C1 and the second case C2, the transmission ratio T may periodically have a minimum value according to the wavelength. For example, in the first case C1, the transmission ratio T may have a minimum value at the third wavelength $\lambda 3$, a fourth wavelength $\lambda 4$, and a fifth wavelength $\lambda 5$, and, in the second case C2, the transmission ratio T may have a minimum value at the sixth wavelength $\lambda 6$, a seventh wavelength $\lambda 7$, and an eighth wavelength 8.

A wavelength difference between the third and fourth wavelengths $\lambda 3$ and $\lambda 4$, a wavelength difference between the fourth and fifth wavelengths $\lambda 4$ and $\lambda 5$, a wavelength difference between the sixth and seventh wavelengths $\lambda 6$ and $\lambda 7$, and a wavelength difference between the seventh and eighth wavelengths $\lambda 7$ and $\lambda 8$ may be the same as each other. The above wavelength differences may be defined as a second wavelength difference D2. The second wavelength difference D2 may be defined as a free spectral range (FSR).

In the third wavelength $\lambda 3$, a difference between the transmission ratio T of the first case C1 and the transmission ratio T of the second case C2 may be defined as a first extinction ratio ER1, and, in the fourth wavelength $\lambda 4$, a difference between the transmission ratio T of the first case C1 and the transmission ratio T of the second case C2 may be defined as a second extinction ratio ER2. When an integer multiple of the second wavelength difference D2 in FIG. 3B is the same as the first wavelength difference in FIG. 3A, the first extinction ratio ER1 may be the same as the second extinction ratio ER2. In other words, an integer multiple of the FSR is the same as the WDM grid, the first extinction ratio ER1 may be the same as the second extinction ratio ER2. When the first extinction ratio ER1 is the same as the second extinction ratio ER2, a constant light modulation characteristic may be obtained.

The second wavelength difference D2 may be determined according to [mathematical equation 2] below.

$$D2 = c/(nL) \quad \text{[Mathematical equation 2]}$$

In the [mathematical equation 2], c is a speed of light, n is a group refractive index of the third light waveguide layer 230, and L is a circumference of the third light waveguide layer 230. The circumference of the third light waveguide layer 230 may be a circumference of a virtual closed curve (a dotted line in FIG. 1D) disposed at a central portion between an outer surface 231 and an inner surface 232 of the third light waveguide layer 230.

The integer multiple of the second wavelength difference D2 may be the same as the first wavelength difference D1, and the first extinction ratio ER1 may be the same as the second extinction ratio ER2 by appropriately adjusting the group refractive index n and the circumference L.

Figure 4:
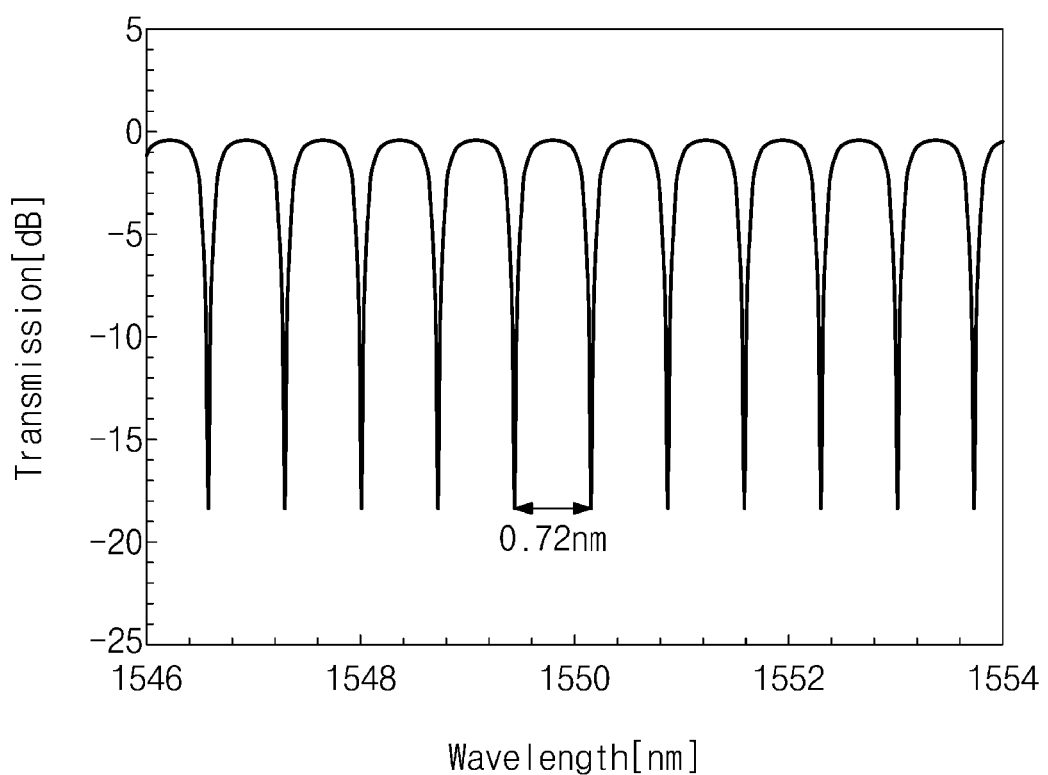
FIG. 4 is a view representing a simulation result of a transmission ratio according to a specific condition.

FIG. 4 is a view representing a simulation result of a transmission ratio according to a specific condition.

Referring to FIG. 4, when a simulation is performed in a condition in which a circumference of the third light waveguide layer 230 is about 902.45 a group refractive index n of the third light waveguide layer 230 is about 3.7, widths of the third light waveguide layer 230 and the fourth waveguide layer 240 are equal to each other, and a loss of the third light waveguide layer 230 is about 3 cm-1, light having a transmission ratio T having a FSR of about 0.72 nm may be emitted.

Figure 5A:
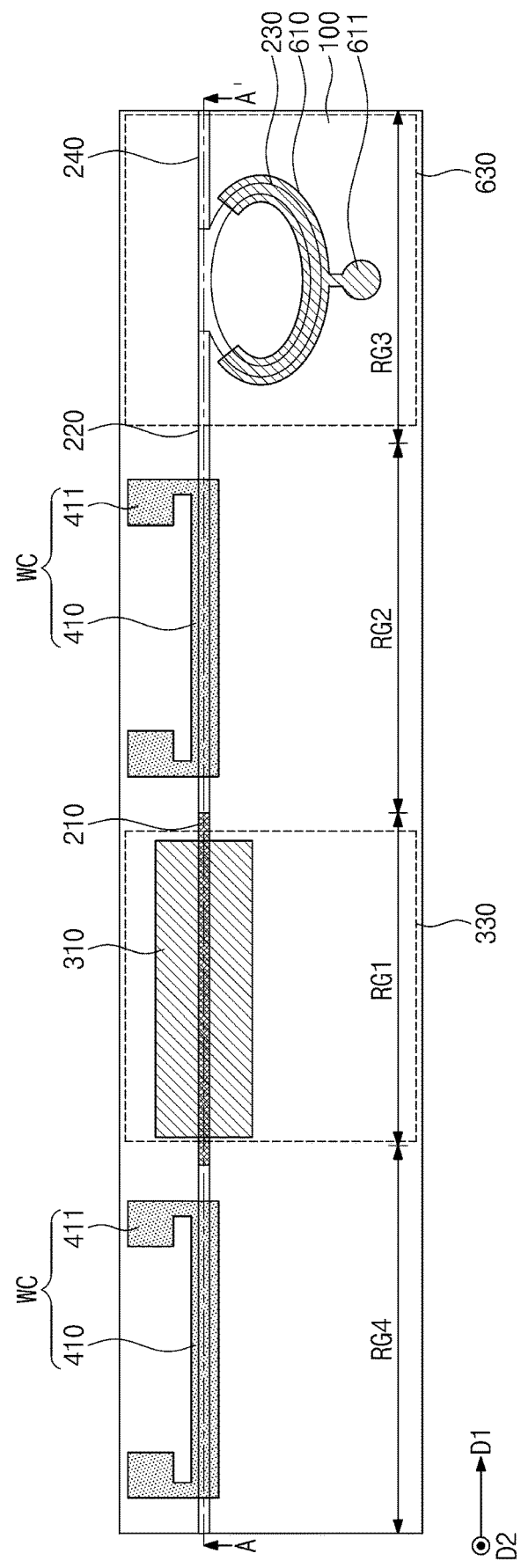
FIG. 5A is a plan view illustrating an optical device according to an embodiment of the inventive concept.
Figure 5B:
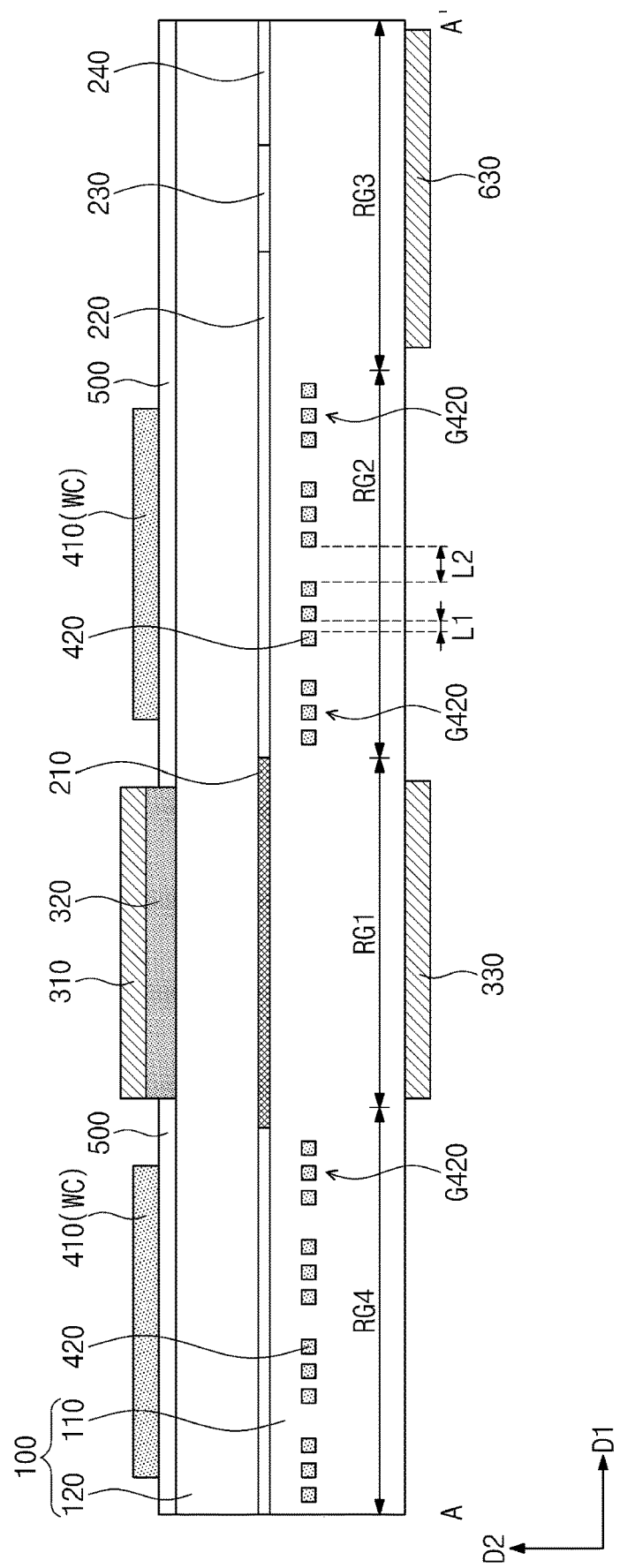
FIG. 5B is a cross-sectional view taken along line A-A' of FIG. 5A.

FIG. 5A is a plan view illustrating an optical device according to an embodiment of the inventive concept. FIG. 5B is a cross-sectional view taken along line A-A' of FIG. 5A. The optical device according to the embodiment is similar to the optical device according to FIGS. 1A, 1B, 1C, and 1D except for description below.

Referring to FIGS. 5A and 5B, the optical device according to the embodiment may include a waveguide path 100 including a first wavelength variable region RG2 and a second wavelength variable region RG4. The first and second wavelength variable regions RG2 and RG4 may be disposed at both sides of a light generation region RG1, respectively.

Gratings 420 provided in each of the first and second wavelength variable regions RG2 and RG4 may be arranged at a constant distance. Three gratings 420, which are arranged relatively close to each other, may be defined as a grating group G420. A distance between gratings 420 in one grating group G420 may be a first distance L1. A distance between the adjacent grating groups G420 may be a second distance L2. The second distance L2 may be greater than the first distance L1. The gratings 420 provided in each of the first and second wavelength variable regions RG2 and RG4 may be defined as sampled gratings.

In the optical device according to the embodiment, light generated from the light generation region RG1 may be reflected and resonated by the grating groups G420 of the first and second wavelength variable regions RG2 and RG4. Light transmitted through the first wavelength variable region RG2 may have a specific peak wavelength.

Figure 6A:
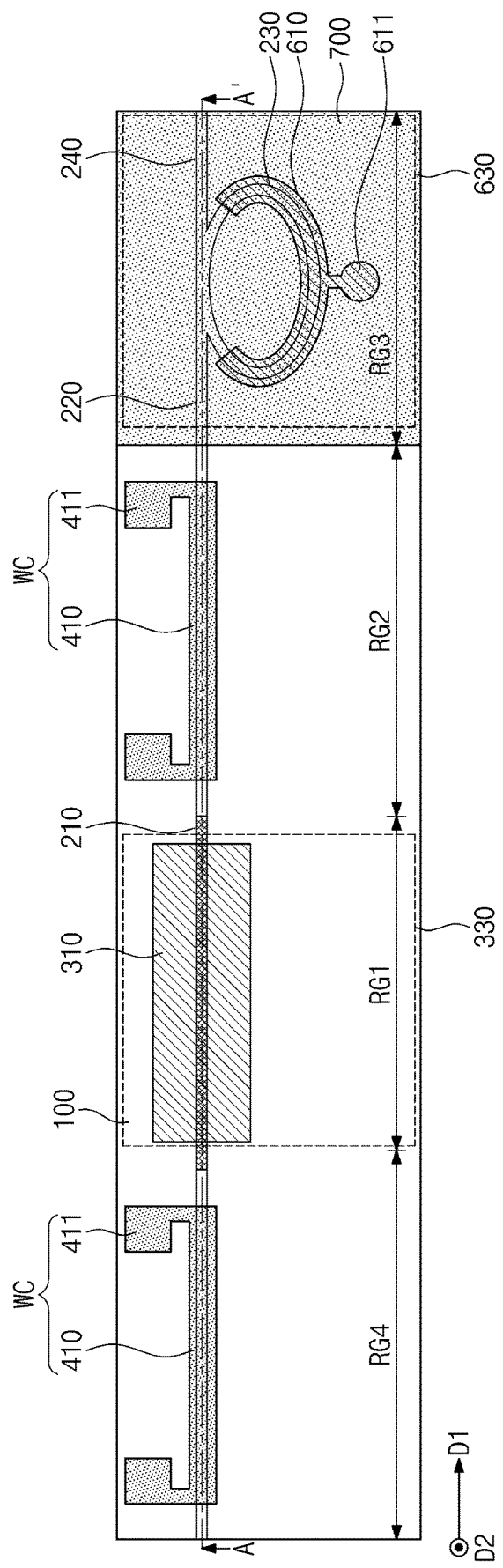
FIG. 6A is a plan view illustrating an optical device according to an embodiment of the inventive concept.
Figure 6B:
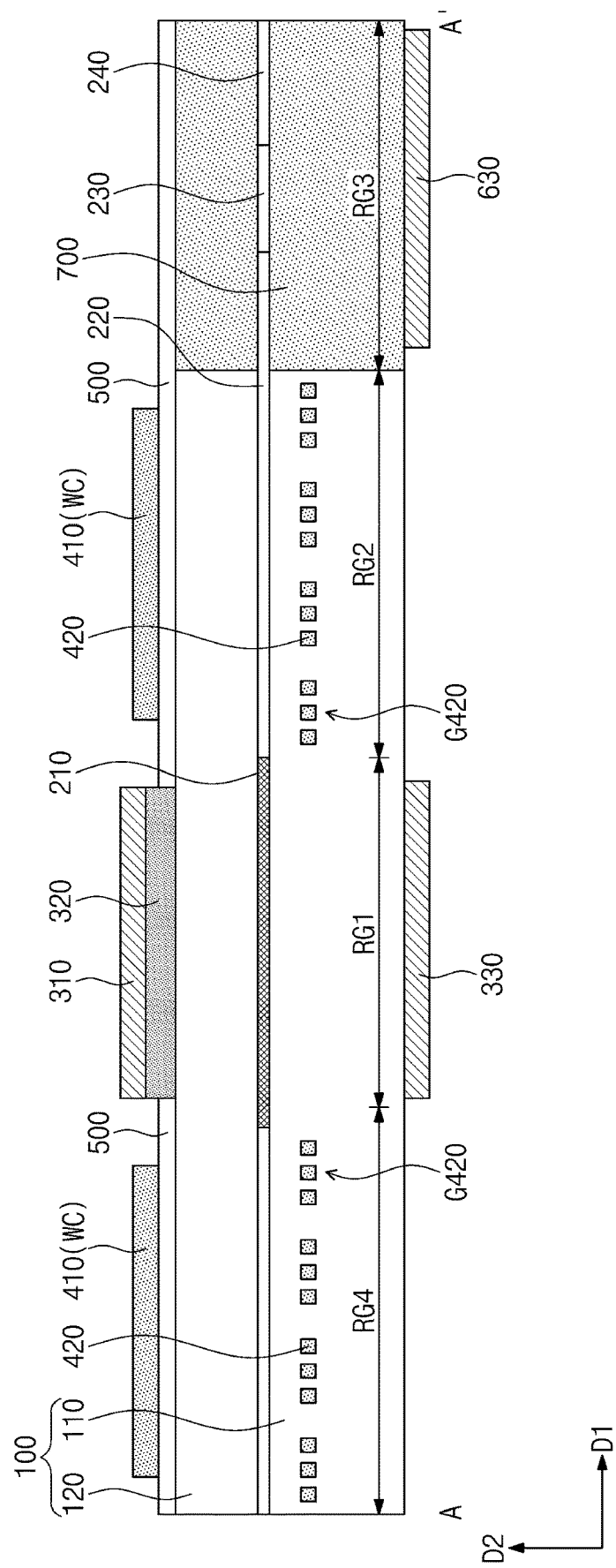
FIG. 6B is a cross-sectional view taken along line A-A' of FIG. 6A.

FIG. 6A is a plan view illustrating an optical device according to an embodiment of the inventive concept. FIG. 6B is a cross-sectional view taken along line A-A' of FIG. 6A. The optical device according to the embodiment is similar to the optical device according to FIGS. 5A and 5B except for description below.

Referring to FIGS. 6A and 6B, the optical device according to the embodiment may include a first waveguide path 100 and a second waveguide path 700. The first waveguide path 100 may include a light generation region RG1, a first wavelength variable region RG2, and a second wavelength variable region RG4. The second waveguide path 700 may be defined as a light modulation region RG3.

The second waveguide path 700 may include a material that is different from that of the first waveguide path 100. The first waveguide path 100 may include a compound semiconductor, and the second waveguide path 700 may include a group semiconductor. For example, the first waveguide path 100 may include InP, and the second waveguide path 700 may include Si or Ge. In the optical device according to the embodiment, the first wavelength variable region RG2 and the light modulation region RG3 may be hybrid-integrated with each other. In other words, the optical device according to the embodiment may be manufactured by coupling a substrate on which the first wavelength variable region RG2 is provided and a substrate on which the light modulation region RG3 is provided.

FIG. 7 is a cross-sectional view illustrating an optical device according to an embodiment of the present invention. The optical device according to the embodiment is similar to the optical device according to FIGS. 1A, 1B, 1C, and 1D except for description below.

Referring to FIG. 7, the optical device according to the embodiment may include a wavelength conversion part WC disposed on a wavelength variable region RG2, and the wavelength conversion part WC may include a wavelength variable electrode 430 and a third ohmic layer 440. The third ohmic layer 440 may be provided on an upper clad layer 120 in the wavelength variable region RG2, and the wavelength variable electrode 430 may be provided on the third ohmic layer 440.

The wavelength variable electrode 430 may include at least one of gold, silver, copper, aluminum, platinum, tungsten, titanium, tantalum, molybdenum, indium, nickel, chrome, or magnesium The third ohmic layer 440 may include a p-type semiconductor material. For example, the third ohmic layer 440 may include InGaAs or GaAs.

A second light generation electrode 330 may extend from a light generation region RG1 to a light modulation region RG3. A portion of the second light generation electrode 330 may vertically overlap a second light waveguide layer 220, the wavelength variable electrode 430, and the third ohmic layer 440. Another portion of the second light generation electrode 330 may vertically overlap a third light waveguide layer 230 and a fourth light waveguide layer 240.

In the optical device according to the embodiment, a refractive index of each of an upper clad layer 120, a second light waveguide layer 220, gratings 420, and a lower clad layer 110 may be varied, and a wavelength of light transmitted through the wavelength variable region RG2 may be varied by a voltage applied to the wavelength variable electrode 430 and the second light generation electrode 330.

Figure 8A:
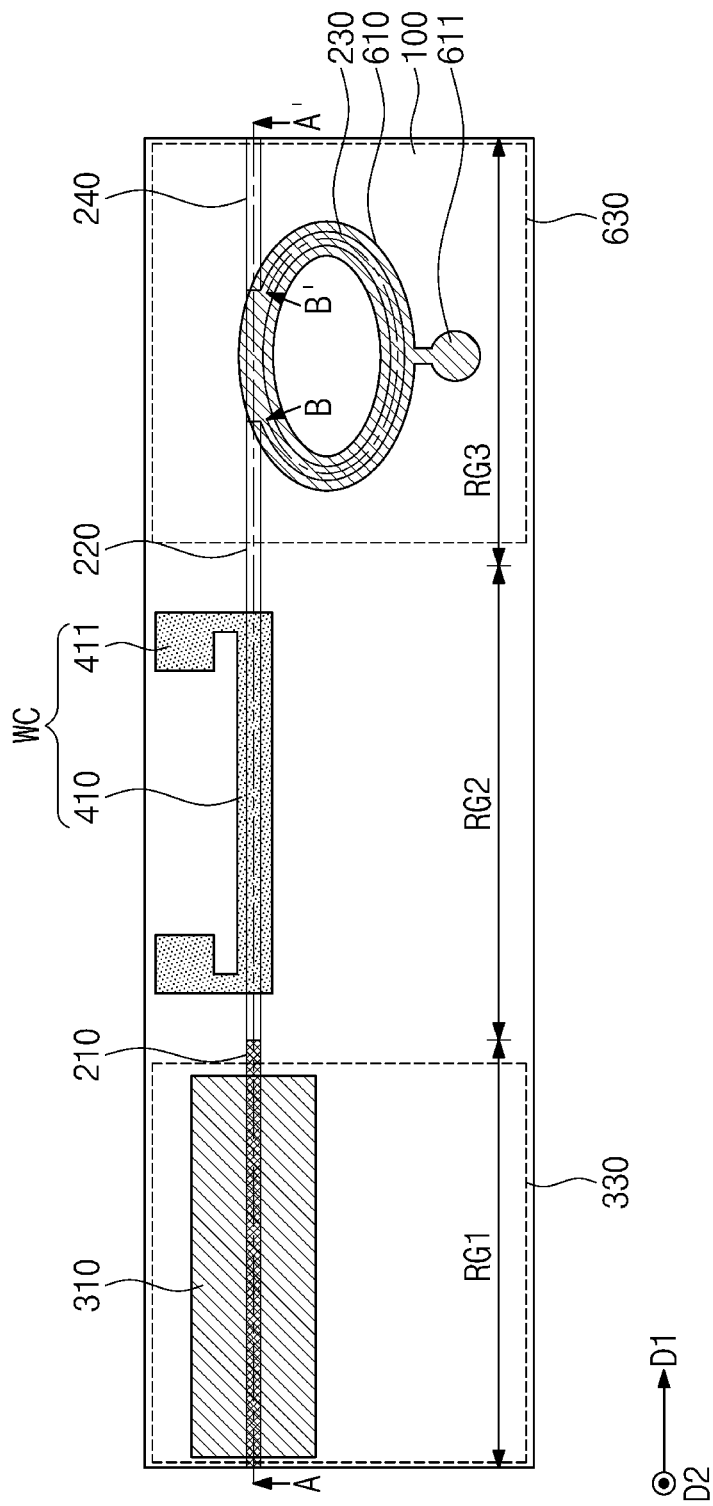
FIG. 8A is a plan view illustrating an optical device according to an embodiment of the inventive concept.
Figure 8B:
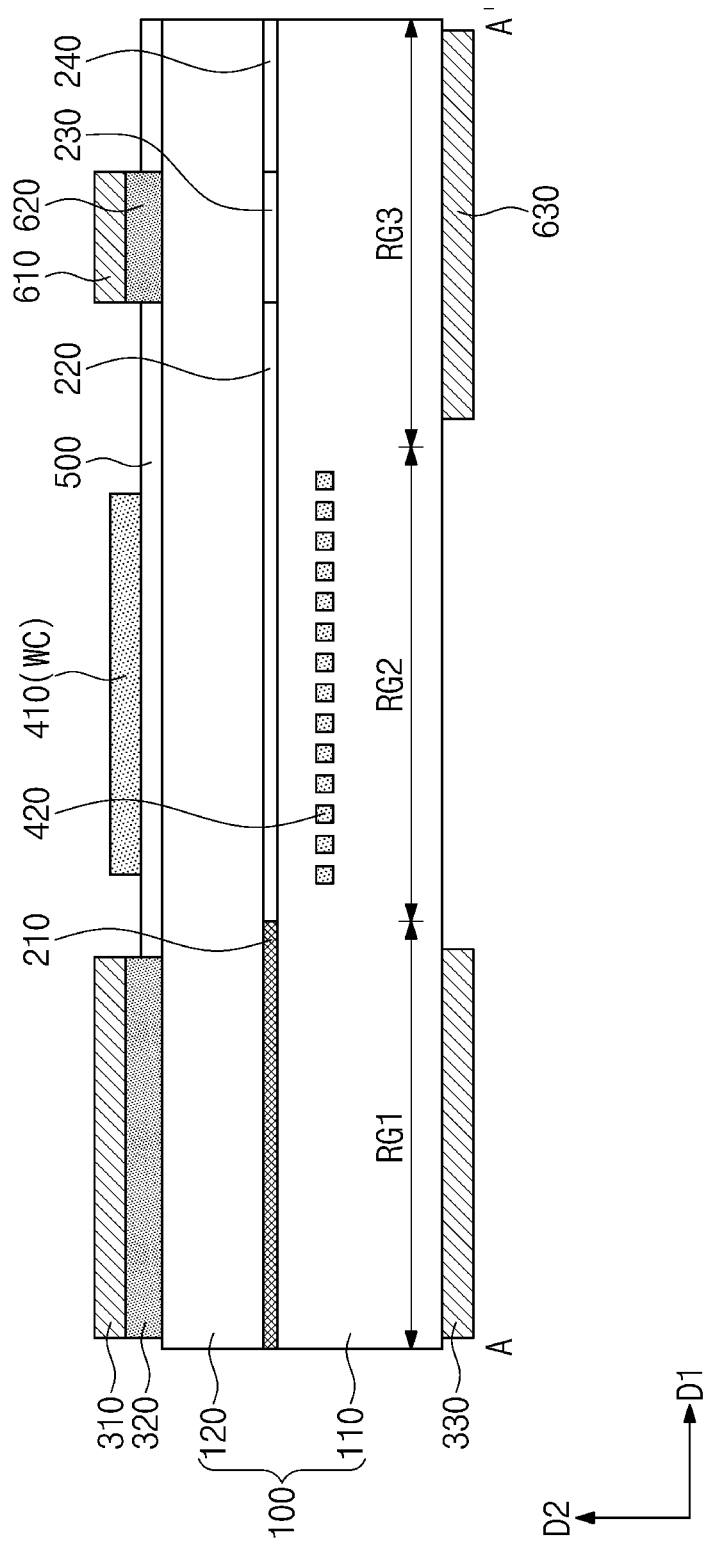
FIG. 8B is a cross-sectional view taken along line A-A' of FIG. 8A.

FIG. 8A is a plan view illustrating an optical device according to an embodiment of the inventive concept. FIG. 8B is a cross-sectional view taken along line A-A' of FIG. 8A. The optical device according to the embodiment is similar to the optical device according to FIGS. 1A, 1B, 1C, and 1D except for description below.

Referring to FIGS. 8A and 8B, the optical device according to the embodiment may include a first light modulation electrode 610 having a ring shape and a second ohmic layer 620 having a ring shape.

In terms of a planar view according to FIG. 8A, each of the first light modulation electrode 610 and the second ohmic layer 620 may have a ring shape. In other words, in terms of the planar view according to FIG. 8A, each of the first light modulation electrode 610 and the second ohmic layer 620 may have a doughnut shape.

The first light modulation electrode 610 and the second ohmic layer 620 may vertically overlap each other. The first light modulation electrode 610 and the second ohmic layer 620 may vertically overlap a portion of a third light waveguide layer 230. Also, the first light modulation electrode 610 and the second ohmic layer 620 may vertically overlap a portion of a second light modulation electrode 630.

The optical device according to the embodiment of the inventive concept may emit the light having the constant light modulation characteristic by including the wavelength variable region and the light modulation region.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Therefore, the embodiments described above include exemplary in all respects and not restrictive, but it should be understood.

What is claimed is:

1. An optical device comprising:
    a waveguide path comprising a light generation region, a wavelength variable region, and a light modulation region;
    a first light waveguide layer provided in the light generation region to generate light;
    a second light waveguide layer provided in the wavelength variable region and connected to the first light waveguide layer;
    a ring-shaped third light waveguide layer provided in the light modulation region and connected to the second light waveguide layer;
    first and second light generation electrodes spaced apart from each other with the light generation region therebetween, and
    first and second light modulation electrodes spaced apart from each other with the light modulation region therebetween,
    wherein the light generation region, the wavelength variable region, and the light modulation region are sequentially arranged in a first direction extending parallel to the waveguide path,
    wherein the first light generation electrode, the first light waveguide layer, and the second light generation electrode overlap each other in a second direction perpendicular to the first direction, and
    wherein the first light modulation electrode, the third light waveguide layer, and the second light modulation electrode overlap each other in the second direction.

2. The optical device of claim 1, further comprising gratings provided in the wavelength variable region.

3. The optical device of claim 2, wherein the second light waveguide layer extends in the first direction, and
    the gratings are arranged in the first direction.

4. The optical device of claim 1, further comprising an ohmic layer disposed between the first light modulation electrode and the light modulation region.

5. The optical device of claim 1, further comprising a wavelength conversion part disposed on the wavelength variable region.

6. The optical device of claim 5, wherein the wavelength conversion part comprises a heating element.

7. The optical device of claim 5, wherein a peak wavelength of the light is converted from a first wavelength to a second wavelength by the wavelength conversion part,
    a difference between the first wavelength and the second wavelength is defined as a first wavelength difference,
    a free spectral range (FSR) of the light emitted from the light modulation region is defined as a second wavelength difference, and
    an integer multiple of the second wavelength difference is the same as the first wavelength difference.

8. The optical device of claim 7, wherein the second wavelength difference satisfies a mathematical equation below:

$$\text{second wavelength difference} = c/nL \quad \text{[Mathematical equation]}$$

in the above mathematical equation, c is a speed of light, n is a group refractive index of the third light waveguide layer, and L is a circumference of the third light waveguide layer.

* * * * *